United States Patent
Rangan et al.

(10) Patent No.: US 6,731,137 B1
(45) Date of Patent: May 4, 2004

(54) PROGRAMMABLE, STAGED, BUS HOLD AND WEAK PULL-UP FOR BI-DIRECTIONAL I/O

(75) Inventors: Gopinath Rangan, Milpitas, CA (US); Chiakang Sung, Milpitas, CA (US); Xiaobao Wang, Santa Clara, CA (US); Philip Pan, Fremont, CA (US); Yan Chong, Mountain View, CA (US); In Whan Kim, San Jose, CA (US); Khai Nguyen, San Jose, CA (US); Bonnie Wang, Cupertino, CA (US); Tzung-Chin Chang, San Jose, CA (US); Joseph Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 46 days.

(21) Appl. No.: 10/131,976

(22) Filed: Apr. 24, 2002

(51) Int. Cl.⁷ .................... H03K 3/356; H03K 19/0175
(52) U.S. Cl. .................... 326/86; 326/82; 326/46; 327/210

(58) Field of Search ............................ 326/17, 38, 46, 326/82, 86, 90; 327/210

(56) References Cited

U.S. PATENT DOCUMENTS

| | | | |
|---|---|---|---|
| 5,973,530 A | * 10/1999 | Morris et al. | 327/210 |
| 6,025,737 A | 2/2000 | Patel et al. | 326/80 |
| 6,118,302 A | 9/2000 | Turner et al. | 326/68 |
| 6,147,511 A | 11/2000 | Patel et al. | 326/81 |
| 6,172,519 B1 | * 1/2001 | Chiang et al. | 326/38 |
| 6,175,952 B1 | 1/2001 | Patel et al. | 716/18 |
| 6,255,850 B1 | 7/2001 | Turner | 326/81 |
| 6,577,157 B1 | * 6/2003 | Cheung et al. | 326/38 |

* cited by examiner

Primary Examiner—Daniel D. Chang
(74) Attorney, Agent, or Firm—Morrison & Foerster

(57) ABSTRACT

The present invention encompasses a bus hold and weak pull-up circuit. A resistor having a first node and a second node is coupled to a bi-directional I/O pin at the first node. The weak pull-up circuit is directly coupled to the resistor at the first node. The bus hold circuit is coupled to the resistor at the second node.

23 Claims, 7 Drawing Sheets

PROGRAMMABLE, STAGED, BUS HOLD AND WEAK PULL-UP FOR BI-DIRECTIONAL I/O

BACKGROUND OF THE INVENTION

1. Field of the Invention

This invention relates generally to integrated circuits, and more specifically to digital logic input/output terminal circuits for interfacing programmable logic devices with other integrated circuit devices.

2. Description of the Related Art

A programmable logic device ("PLD") is an integrated circuit adapted to permit a user to establish an arbitrary logic circuit of his own. A PLD includes primarily a configurable programmable logic element ("PLE") for constructing a user's own logic, a memory cell for defining a circuit function, and multiple programmable input/output ("I/O") circuits for each of its externally accessible I/O pins. The programmable I/O circuits can be used to input electronic signals to and output electronic signals from PLDs and/or integrated circuit devices in a variety of types of electronic systems. For example, the programmable I/O circuits may be used to interface multiple PLDs through a bi-directional bus so that they may communicate with each other.

Each I/O pin connected to the bi-directional bus always remains in a valid state provided there is a driver imposing a defined logic state on the bi-directional bus. However, when all 3-state output bus drivers connected to the bi-directional bus are in an inactive, high-impedance state, a voltage determined by the leakage currents of the components connected to the bi-directional bus develops giving rise to an entirely undefined voltage level at the I/O pins. An I/O pin having an undefined voltage level is known as a floating I/O pin. Allowing I/O pins to float can result in increased power consumption caused by the leakage currents from affected components and/or excessive noise due to unwanted oscillatory outputs. Increased power consumption or voltage oscillation can cause damage to all components connected to the bi-directional bus and disturb the electronic system. Therefore, all I/O pins should be held at a valid logic state when they are not being used, or when the output driver circuit driving them is placed in a high-impedance state.

In many instances, bus hold and/or weak pull-up circuits are used to resolve floating I/O pin problems. FIG. 1 shows a conventional implementation of a bus hold and weak pull-up circuit ("conventional bus hold and weak pull-up circuit") 100 used in a PLD programmable I/O circuit. The conventional bus hold and weak pull-up circuit 100 includes a weak pull-up circuit 105, a bus hold circuit 110, an inverter 150, and a switch transistor (switch) 115. The weak pull-up circuit 105 is connected to a first node of the switch 115 and the bus hold circuit 110 is connected to a second node of the switch 115. The bus hold circuit 110 includes a first resistor 140, a first CMOS inverter 125, a second CMOS inverter 130, and a second resistor 145 connected back to back forming a latch. The weak enable circuit 105 is a p-channel transistor. The switch transistor 115 is also a p-channel transistor. The input of inverter 150 is connected to the gate of the switch transistor 115 and the output of the inverter 150 is connected to the weak enable circuit 105. The first resistor 140 is 8.5 K Ohms and the second resistor 145 is 7.5 K Ohms. The conventional bus hold and weak pull-up circuit 100 can be programmed to enable or disable the weak pull-up circuit 105 when the PLD is in programming mode. Furthermore, the conventional bus hold and weak pull-up circuit 100 can be programmed to operate in weak pull-up mode, bus hold mode, or neither when the PMD is in user operating mode.

The conventional bus hold and weak pull-up circuit 100 was designed to provide both the 'last state' hold feature and the resistor pull-up feature to eliminate the occurrence of floating I/O pins without glitches when operating in user operating mode. However, the conventional bus hold and weak pull-up circuit 100 does not eliminate the occurrence of floating I/O pins when the PLD transitions from programming mode to user operating mode. For instance, PLD I/O pins may float for a period of time as the conventional bus hold and weak pull-up circuit 100 transitions from programming mode with the weak pull-up feature enabled to user operating mode with the bus hold feature enabled. In another instance, PLD I/O pins may float for a period of time as the conventional bus hold and weak pull-up circuit 100 transitions from programming mode to user operating mode where the weak pull-up feature is disabled in programming mode and the bus hold feature is enabled in user operating mode. Examples of these two instances are given below.

FIG. 2 shows a timing diagram illustrating the operation of the conventional bus hold and weak pull-up circuit 100 when transitioning from the weak pull-up feature in programming mode to the bus hold feature in user operating mode. The PLD is in programming mode from time $t_0$ until time $t_2$. The PLD switches to user operating mode at time $t_2$. At time $t_0$ the bus hold enable signal ($\overline{EN_2}$) is at a logical high state, the switch enable signal ($\overline{EN_1}$) is at a logical high state, and the weak pull-up enable signal ($\overline{EN_1}$) is at a logical low state. A logical high state can herein be referred to as high and a logical low state can herein be referred to as low. When $\overline{EN_2}$ is high, the first inverter 125 and the second inverter 130 are both disabled, thus the bus hold feature is disabled. When $EN_1$ is high, the switch 105 is open disconnecting the bus hold circuit 110 from the weak pull-up circuit 105 and the I/O pin 120. Node 135, which represents the bus hold value (BH-VAL) floats when the bus hold circuit 110 is disabled, or when the bus hold circuit is disconnected from the I/O pin 120 and weak pull-up circuit 105. Therefore, node 135 floats at time $t_0$. When $\overline{EN_1}$ is low, the weak pull-up circuit 105 is enabled. The weak pull-up circuit 105 pulls-up the I/O pin 120 to a defined logic state (e.g. VCC) to prevent the I/O pin 120 from floating. Accordingly, the weak pull-up circuit 105 pulls-up the I/O pin 120 to a logical high state at time $t_0$.

At time $t_1$ the first CMOS inverter 125 and the second CMOS inverter 130 are enabled when $\overline{EN_2}$ transitions from a high to a low. Since the node 135 remains floating at time $t_1$ the outputs of the first and second CMOS inverters 125 and 130 also remain floating. However, since CMOS inverters generally have a defined state at their output, the outputs of the CMOS inverters 125 and 130 eventually settle to either a logical high or a logical low after a period of time. Whether the outputs of the first and second CMOS inverters 125 and 130 settle to a high or a low is not known until the outputs of the first and second CMOS inverters 125 and 130 are actually measured. For purposes of this example, the output of the second CMOS inverter 130 settles to a low. Therefore, node 135 also settles to a low. Note that at time $t_1$ the weak pull-up circuit 105 remains enabled, thus the I/O pin 120 remains high.

At time $t_2$ the PLD transitions from programming mode to user operating mode when $EN_1$ transitions from a high to a low and $\overline{EN_1}$ transitions from a low to a high. This event disables the weak pull-up circuit 105 and closes the switch 115 placing the logical state at node 135 (a logical low) in contention with the logical state at the I/O pin 120 (a logical high). This contention causes the I/O pin 120 to toggle or float for a period of time before the logical high node 135 forces the I/O pin 120 to a logical low at time $t_3$. This result is undesirable to users who are expecting the I/O pin 120 to remain at a logical high at time $t_2$ when the PLD transitions from programming to user operating mode. As stated above, allowing I/O pins to float can result in increased power consumption caused by the leakage currents from affected components and/or excessive noise due to unwanted oscillatory outputs. Furthermore, increased power consumption or voltage oscillation can cause damage to all components connected to the bi-directional bus and disturb the electronic system.

FIG. 3 shows a timing diagram that illustrates the operation of the conventional bus hold and weak pull-up circuit 100 as the PLD transitions from programming mode with the weak pull-up feature disabled to user operating mode with the bus hold feature enabled. The PLD is in programming mode from time $t_0$ until time $t_2$. The PLD switches to user operating mode at time $t_2$. At time $t_0$ $\overline{EN_1}$ is high, $\overline{EN_1}$ is low, and $\overline{EN_2}$ is high, thus the weak enable pull-up circuit 105 is disabled, the switch 115 is closed, and the bus hold circuit 110 is disabled. When the bus hold circuit 110 arid the weak pull-up circuit 105 are disabled, the I/O pin 120 floats for a period of time before settling to either a high or a low. Whether the I/O pin 120 settles to a high or a low is not known until the logical value of the I/O pin 120 is actually measured. For purposes of this example, the I/O pin 120 settles to a high at time $t_1$.

Although the switch 115 is closed at time to, the logical state of the I/O pin 120 is not stored at node 135 since the bus hold circuit 110 is disabled. Therefore, the node 135 also floats at time $t_o$. Note, however, that node 135 floats independent with respect to the I/O pin 120. Whether node 135 settles to a high or a low is not known until the logical state at node 135 is actually measured. For purposes of this example, node 135 settles to a low at time $t_1$.

The PLD transitions from programming mode to user operating mode and the bus hold circuit 110 is enabled when $\overline{EN_2}$ transitions from a high to a low at time $t_2$. This event causes a logical low is to be stored at node 135, placing the logical state at node 135 (a logical low) in contention with the logical state at the I/O pin 120 (a logical high). This contention causes the I/O pin 120 to toggle or float for a period of time before the logical state at node 135 forces the I/O pin 120 to a low at time $t_3$. This result is undesirable to users who are expecting the I/O pin 120 to remain high at time $t_2$ when the PLD transitions from programming to user operating mode. Again, allowing I/O pins to float can result in increased power consumption caused by the leakage currents from affected components and/or excessive noise due to unwanted oscillatory outputs. Furthermore, increased power consumption or voltage oscillation can cause damage to all components connected to the bidirectional bus and disturb the electronic system. Thus, there is a need for a bus hold and weak pull-up circuit which completely eliminates the occurrence of floating I/O pins during all phases of PLD operation.

SUMMARY OF THE INVENTION

The present invention encompasses a bus hold and weak pull-up circuit. A resistor having a first node and a second node is coupled to a bidirectional I/O pin at the first node. The weak pull-up circuit is directly coupled to the resistor at the first node. The bus hold circuit is coupled to the resistor at the second node.

The present invention is explained in more detail below with reference to the drawings.

DETAILED DESCRIPTION OF THE PREFERRED EMBODIMENT

The present invention is directed to a programmable, staged, bus hold and weak pull-up circuit utilized in integrated circuit (IC) devices, and in particular in programmable logic devices (PLDs). The following description is presented to enable any person skilled in the art to make and use the invention, and is provided in the context of a particular application and its requirements. Although the programmable, staged, bus hold and weak pull-up circuit is described below with reference to PLDs, the present invention may be beneficially utilized in other types of IC devices. Therefore, the appended claims should not be limited to PLD applications utilizing the programmable, staged, bus hold and weak pull-up circuit. Furthermore, various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 4:
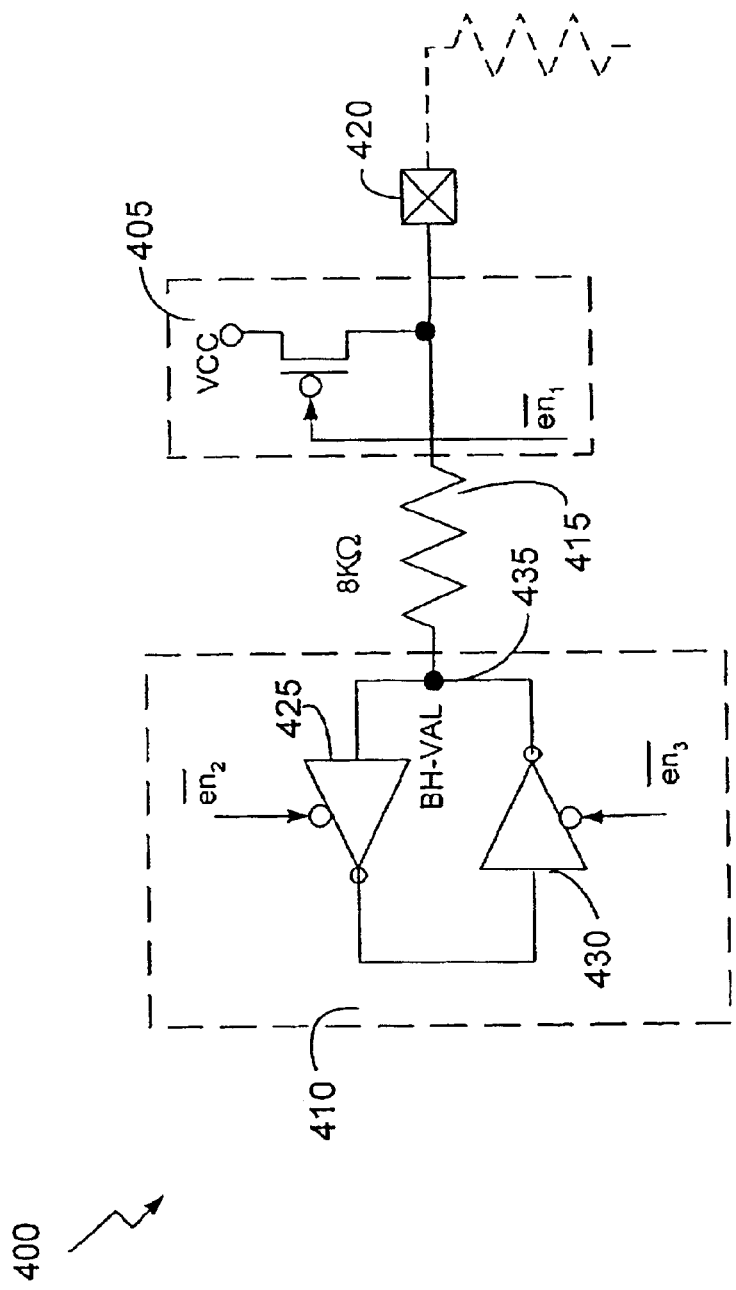
FIG. 4 shows an embodiment of a programmable, staged, bus hold and weak pull-up circuit.

FIG. 4 shows an embodiment of a programmable, staged, bus hold and weak pull-up circuit ("bus hold and weak pull-up circuit") 400 used in a PLD programmable I/O circuit However, as stated above, the bus hold and weak pull-up circuit 400 can be utilized in other types of IC devices, for example, Application Specific Integrated Circuits (ASICS) having I/O pins driven by tri-state drivers.

The bus bold and weak pull-up circuit 400 includes a weak pull-up circuit 405, a bus hold circuit 410, and a resistor 415. The weak pull-up circuit 405 is directly connected to a first node of the resistor 415. The I/O pin 420 is also directly connected to the first node of the resistor 415. The bus hold circuit 410 is directly connected to the second node of the resistor 415. In one embodiment, the resistor 415 is 8 K Ohms, the bus hold circuit 410 includes a first CMOS inverter 425 and a second CMOS inverter 430 cross coupled to form a latch, and the weak pull-up circuit 405 includes a pnp transistor. When the PLD is in programming mode, the bus hold and weak pull-up circuit 400 can be programmed to enable or disable the weak pull-up circuit 405. When the PLD is in user operating mode, the bus hold and weak pull-up circuit 400 can be programmed to operate in weak pull-up mode, bus hold mode, or neither.

The bus hold and weak pull-up circuit 400 provides an advantage over the conventional bus hold and weak pull-up circuit 100 by eliminating the occurrence of floating I/O pins during all phases of the PLD's operation. The bus hold and weak pull-up circuit 400 provides another advantage over the conventional bus hold and weak pull-up circuit 100 by eliminating the switch 115 and reducing the two resistors 140 and 145 to one resistor 415. The elimination of the switch 115 and one resistor lowers production costs and provides more board space.

Figure 5:
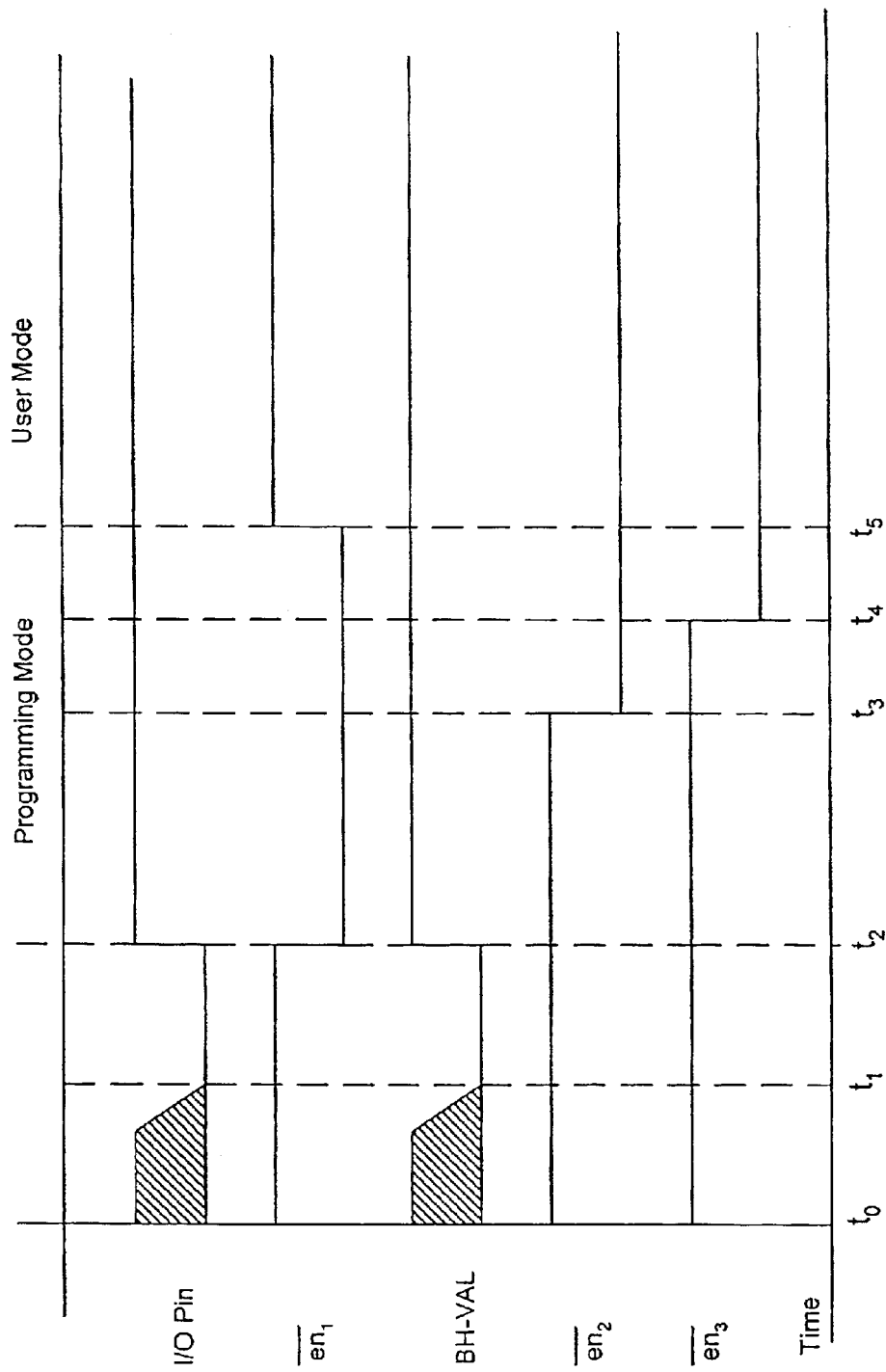
FIG. 5 shows one example of a timing diagram that illustrates the operation of the programmable, staged, bus hold and weak pull-up circuit when transitioning from the weak pull-up feature in programming mode to the bus hold feature in user operating mode.

FIG. 5 shows one example of a timing diagram that illustrates the operation of the bus hold and weak pull-up circuit 400 when transitioning from the weak pull-up feature in programming mode to the bus hold feature in user operating mode. The PLD is in programing mode from time $t_2$ until time $t_5$. The PLD switches to user operating mode at time $t_4$. At time $t_0$ the first inverter enable signal ($\overline{EN_2}$) is at a logical high state, the second inverter enable signal ($\overline{EN_3}$) is at a logical high state, and the weak enable signal ($\overline{EN_1}$) is at a logical high state. A logical high state can herein be referred to as a high and a logical low state can herein be referred to as a low.

When $\overline{EN_2}$ and $\overline{EN_3}$ are high, the first CMOS inverter 425 and the second CMOS inverter 430 are disabled respectively. The bus hold circuit 410 is disabled when either the first CMOS inverter 425 and/or the second CMOS inverter 430 are disabled. Note that when the bus hold circuit 410 is disabled, there is no voltage drop across the resistor 415. Therefore, node 435 and the I/O pin 420 are at the same logical state when the bus hold circuit 410 is disabled.

When $\overline{EN_1}$ is high, the weak pull-up circuit 405 is disabled causing the I/O pin 420 to float for a period of time before settling to either a high or a low at time $t_1$. Whether the I/O pin 420 settles to a high or a low is not known until the logical state of the I/O pin 420 is actually measured. For purposes of this example, the I/O pin 420 settles to a low at time $t_1$. Since node 435 and the I/O pin 420 are at the same logical state when the bus hold circuit 410 is disabled, node 435 also floats for a period before settling to a low at time $t_1$ as shown in FIG. 5.

The PLD is in programming mode and the weak pull-up circuit 405 is enabled at time $t_2$ when the signal $\overline{EN_1}$ transitions from a high to a low. The weak pull-up circuit 405 pulls-up the I/O pin 420 and node 435 to a logical high (e.g. VCC), thus preventing the I/O pin 420 and node 435 from floating. At time $t_3\overline{EN_2}$ transitions from a high to a low enabling the first CMOS inverter 425. The logical high at node 435 and the input of the CMOS inverter 425 then gets converted to a logical low at the output of the CMOS inverter 425. However, the bus hold circuit 410 remains disabled since the second inverter 430 remains disabled at time $t_3$.

At time $t_4\overline{EN_3}$ transitions from a high to a low enabling the bus hold circuit 410. The logical low at the output of the CMOS inverter 425 and the input of CMOS inverter 430 gets converted to a logical high at the output of CMOS inverter 430. The logical high at the output of CMOS inverter 430 is then fed back to node 435. Thus, when enabled, the bus hold circuit 410 maintains node 435 at the last driven logical state present at the I/O pin 420 at time $t_4$. As shown in FIG. 5, the last driven logical state at the I/O pin 420 at time $t_4$ is a logical high. At time $t_5\overline{EN_1}$ transitions from a low to a high disabling the weak pull-up circuit 405. This event also transitions the PLD from programming mode to user operating mode. When the weak pull-up circuit 405 is disabled at time $t_5$, as stated above, the bus hold circuit 410 maintains the I/O pin 420 at a logical high state. Thus, the I/O pin 420 does not toggle or float as the PLD transitions firm programming mode to user operating mode at time $t_5$.

Figure 6:
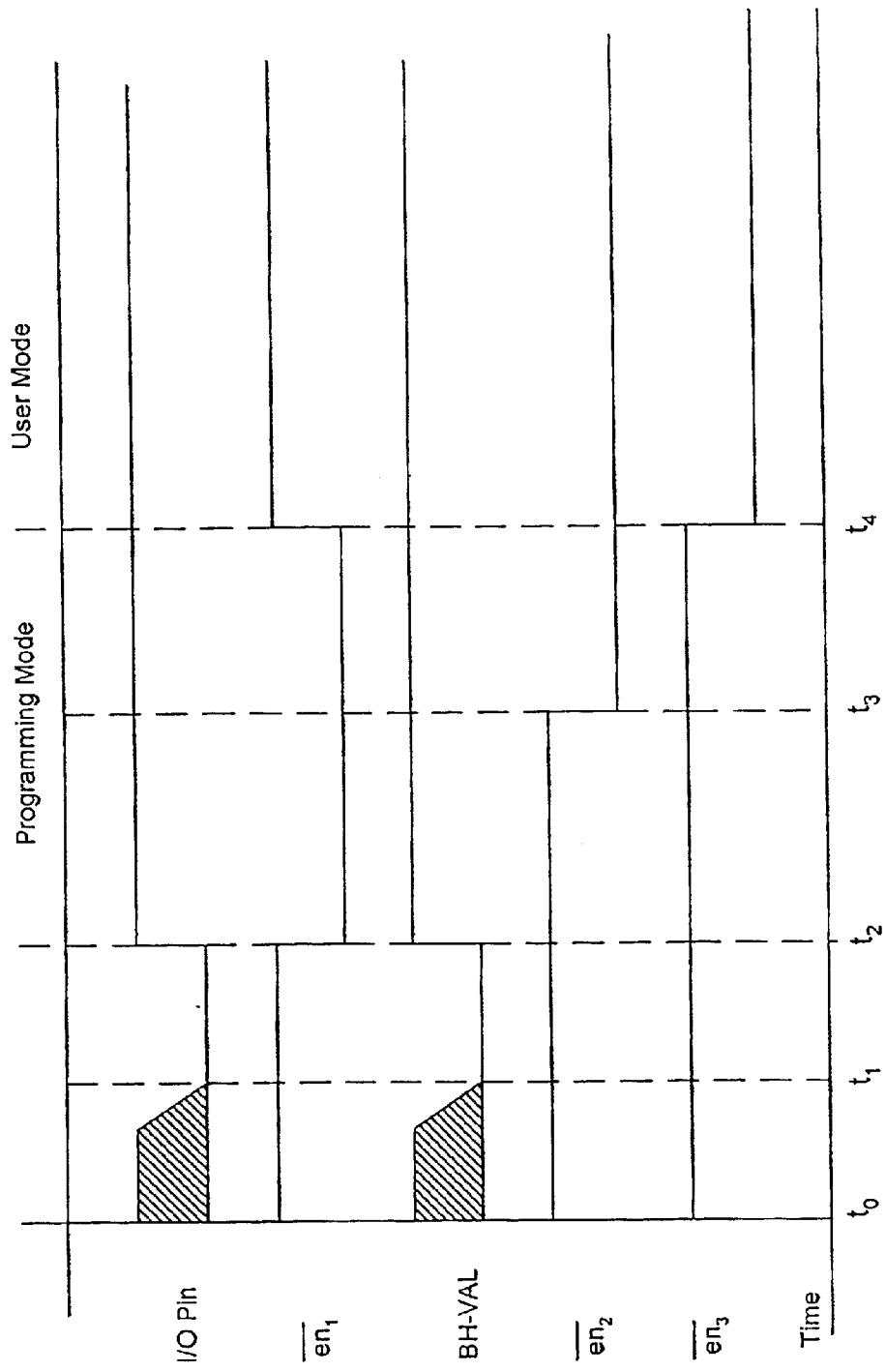
FIG. 6 shows another example of a timing diagram that illustrates the operation of the programmable, staged, bus hold and weak pull-up circuit when transitioning from the weak pull-up feature in programming mode to the bus hold feature in user operating mode.

In another example shown in FIG. 6, at time $t_4\overline{EN_1}$ transitions from a low to a high and $\overline{EN_3}$ transitions from a high to a low simultaneously disabling the weak pull-up circuit 405 and enabling the bus hold circuit 410. This event also transitions the PLD from programming mode to user operating mode. When enabled, the bus hold circuit 410 maintains node 435 at the last driven logical state present at the I/O pin 420 at time $t_4$. As shown in FIG. 5, the last driven logical state at the I/O pin 420 at time $t_4$ is a logical high. Therefore, the bus hold circuit 410 sustains a logical high at node 435 at time $t_4$ until it is overdriven with a new value. When the weak pull-up circuit 405 is disabled at time $t_4$, the bus hold circuit 410 maintains the 1/O pin 420 at a logical high state. Thus, the I/O pin 420 does not toggle or float as the PLD transitions from programming mode to user operating mode at time $t_4$.

Figure 1:
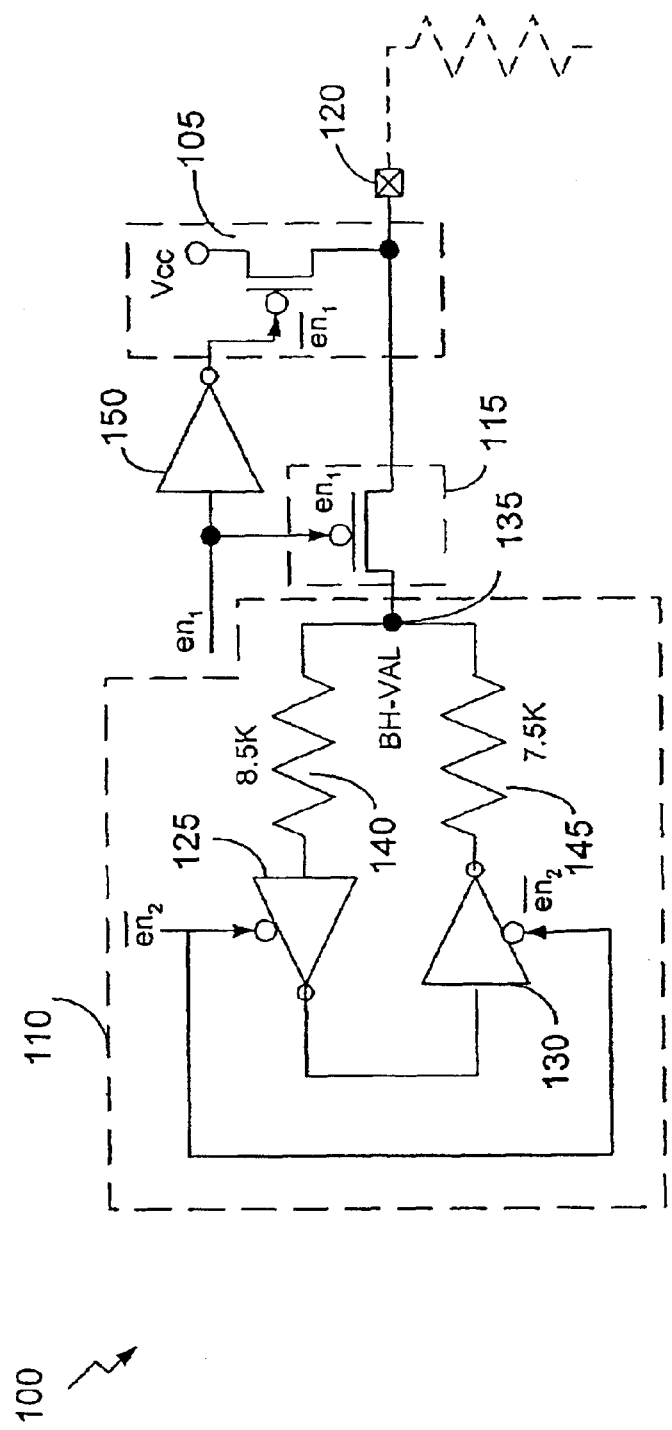
FIG. 1 shows a conventional implementation of a bus hold and weak pull-up circuit.
Figure 2:
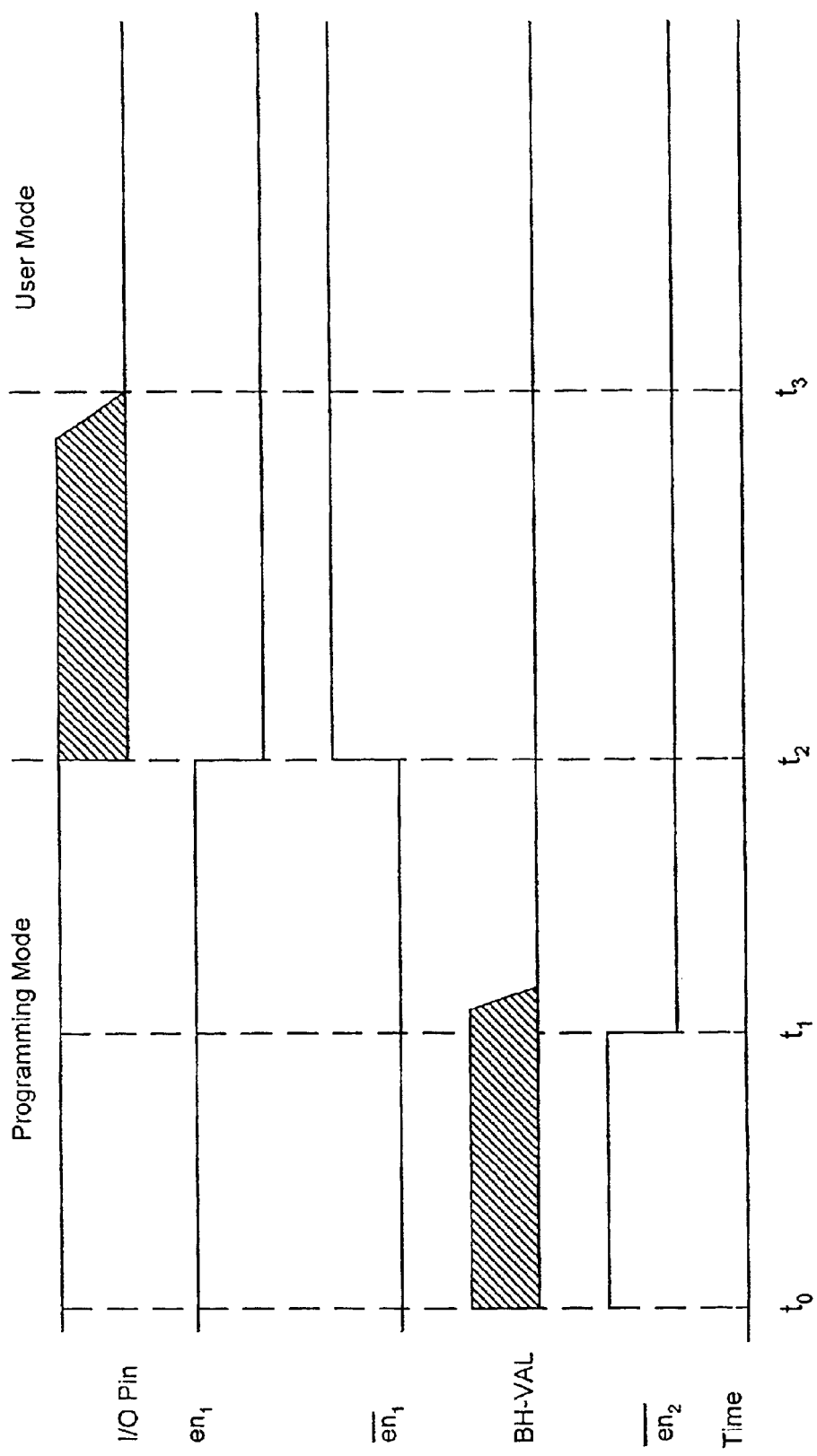
FIG. 2 shows a timing diagram illustrating the operation of the conventional bus hold and weak pull-up circuit when transitioning from the weak pull-up feature in programming mode to the bus hold feature in user operating mode.
Figure 3:
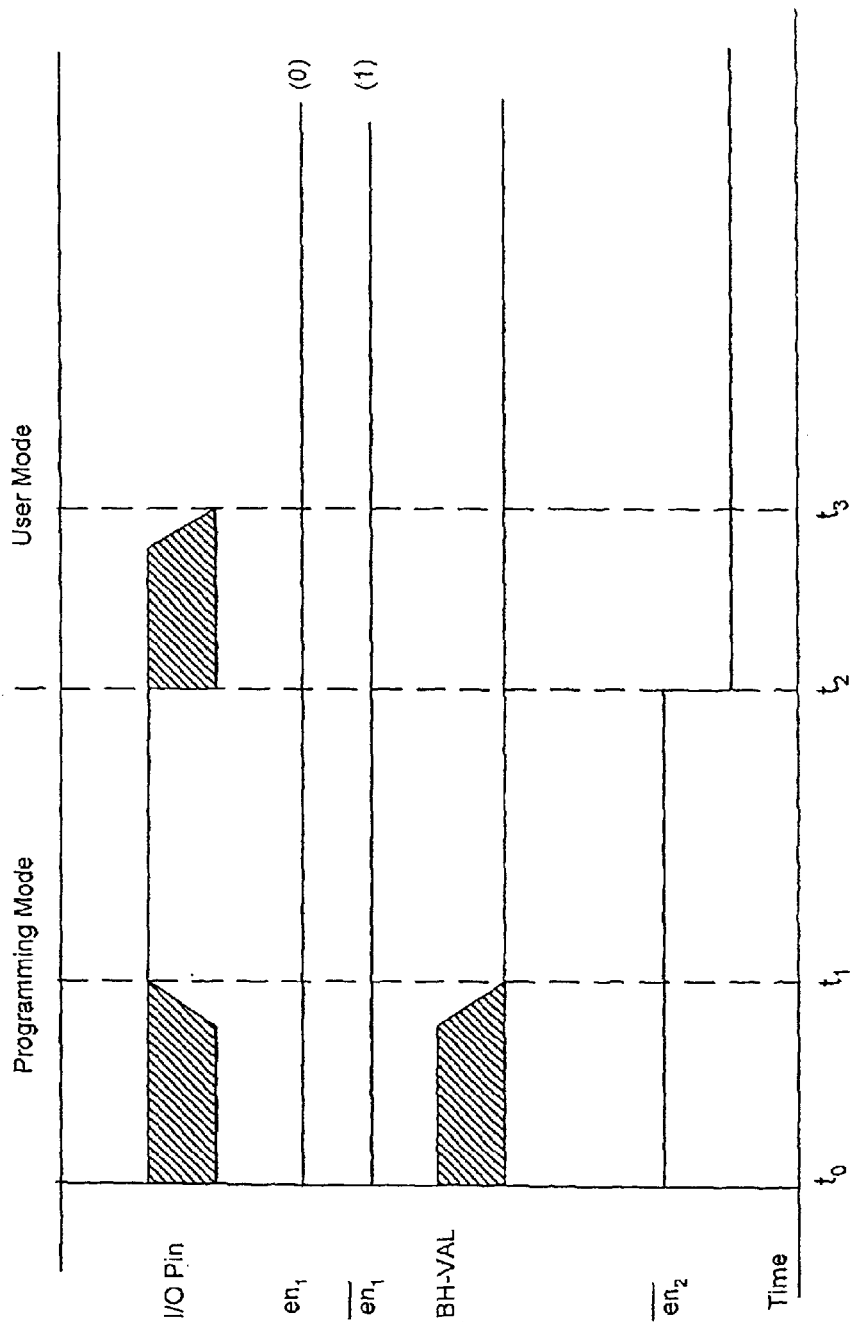
FIG. 3 shows a timing diagram that illustrates the operation of the conventional bus hold and weak pull-up circuit when transitioning from programming mode with the weak pull-up feature disabled to user operating mode with the bus hold feature enabled.
Figure 7:
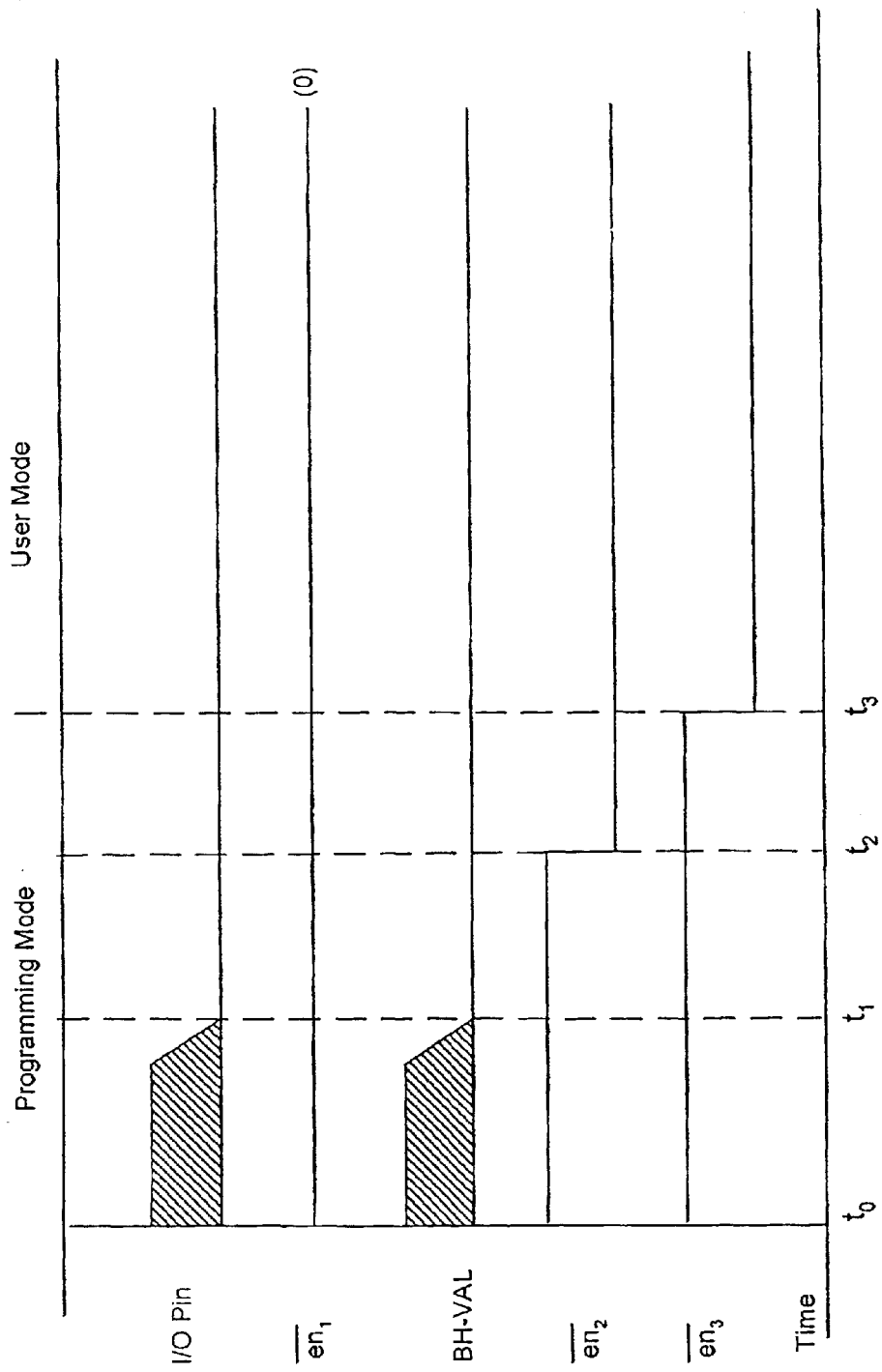
FIG. 7 shows a timing diagram that illustrates the operation of the programmable, staged, bus hold and weak pull-up circuit when transitioning from programming mode with the weak pull-up feature disabled to user operating mode with the bus hold feature enabled.

FIG. 7 shows a timing diagram that illustrates the operation of the bus hold and weak pull-up circuit 400 as the PLD transitions from programming mode with the weak pull-up feature disabled to user operating mode with the bus hold feature enabled. The PLD is in programming mode from time $t_0$ until time $t_3$. The PLD switches to user operating mode at time $t_3$. At time $t_0\overline{EN_1}$ is low, $\overline{EN_2}$ is high, and $\overline{EN_3}$ is high, thus the weak pull-up circuit 105 is disabled, and the bus hold circuit 110 is disabled. As shown in FIG. 3, at time $t_0$ the I/O pin 120 and node 435 float for a period of time before eventually settling to either a high or a low since neither the bus hold circuit 110 nor the weak pull-up circuit 105 are enabled. Whether the I/O pin 420 and node 435 settle to a high or a low cannot be determined until their respective logical values are actually measured. For purposes of this example, the I/O pin 420 and node 435 settle to a low at time $t_1$.

At time $t_2$ $\overline{EN_2}$ transitions from a high to a low enabling the first inverter 425. However, the bus hold circuit 410 remains disabled at time $t_2$ since inverter 430 remains disable. At time $t_3$ the PLD transitions from programming mode to user operating mode as $\overline{EN_3}$ transitions from a high to a low, thus enabling inverter 430. This event also enables the bus hold circuit 410 since both inverters 425 and 430 are now enabled. The bus hold circuit 410 maintains node 435 at the last logical state present at the I/O pin 420 when the bus hold circuit 410 is enabled at time $t_3$. As shown in FIG. 6, the logical state at the I/O pin 420 at time $t_3$ is a logical low. The bus hold circuit 410 also maintains the I/O pin 420 at a logical low state at time $t_3$. Thus, the I/O pin 420 does not toggle or float as the PLD transitions from programming mode to user operating mode.

What is claimed is:

1. A bus hold and weak pull-up circuit comprising:
   a passive resistor having a first and a second node, said passive resistor coupled to a bi-directional I/O pin at said first node;
   a weak pull-up circuit directly coupled to said passive resistor at said first node; and
   a bus hold circuit directly connected to said passive resistor at said second node.

2. The bus hold and weak pull-up circuit of claim 1, wherein said weak pull-up circuit comprises a p-channel transistor.

3. The bus hold and weak pull-up circuit of claim 2, wherein said p-channel transistor is gate enabled.

4. The bus hold and weak pull-up circuit of claim 1, wherein said bus hold circuit comprises a first CMOS inverter and a second CMOS inverter.

5. The bus hold and weak pull-up circuit of claim 4, wherein said first CMOS inverter and said second CMOS inverter are cross coupled.

6. The bus hold and weak pull-up circuit of claim 5, wherein said first CMOS inverter and said second CMOS inverter are separately enabled.

7. The bus hold and weak pull-up circuit of claim 1, wherein said passive resistor is 8 K Ohms.

8. The bus hold and weak pull-up circuit of claim 1, wherein said integrated circuit device is an ASIC having I/O pins driven by tri-state drivers or a Programmable Logic Device.

9. A method for operating a bus hold and weak pull-up circuit, wherein said weak pull-up circuit is directly coupled to a bi-directional I/O pin and a resistor at a first node and said bus hold circuit is directly coupled to said resistor at a second node, the method comprising:
   enabling a programming mode for configuring an integrated circuit device; and
   enabling a user operating mode after said integrated circuit device is configured, wherein said bus hold circuit maintains said second node at a defined logical state last present at said bi-directional I/O pin when said programming mode terminates.

10. The method of claim 9, wherein said weak pull-up circuit is enabled or disabled during programming mode and/or user operating mode.

11. The method of claim 9, wherein said bus hold circuit is enabled or disabled during programming mode.

12. The method of claim 9, wherein said bus hold circuit is enabled before, after, or simultaneously as said weak pull-up circuit is disabled.

13. The method of claim 9, wherein said defined logical state is a logical high or a logical low.

14. The bus hold and weak pull-up circuit of claim 9, wherein said integrated circuit device is an ASIC having I/O pins driven by tri-state drivers or a Programmable Logic Device.

15. A bus hold and weak pull-up circuit comprising:
   means for resistance having a first and a second node, said means for resistance coupled to said bi-directional I/O pin at said first node;
   means for maintaining a defined logical state at said bi-directional I/O pin during an integrated circuit device programming mode; and
   means directly connected to said second node and for maintaining said second node at said defined logical state last present at said bidirectional I/O pin when transitioning from said integrated circuit device programming mode to a user operating mode.

16. The bus hold and weak pull-up circuit of claim 15, wherein said defined logical state is a logical high or a logical low.

17. A bus hold and weak pull-up circuit comprising:
   a passive resistor having a first and a second node, said passive resistor coupled to a bidirectional I/O pin at said first node;
   a p-channel transistor directly coupled to said resistor at said first node; and
   a first CMOS inverter and a second CMOS inverter coupled to said passive resistor at said second node, wherein an input of said first CMOS inverter is directly coupled to said passive resistor at said second node, an output of said first CMOS inverter is directly coupled to an input of said second CMOS inverter, and an output of said second CMOS inverter is directly coupled to said passive resistor at said second node.

18. The bus hold and weak pull-up circuit of claim 17, wherein said p-channel transistor is gate enabled.

19. The bus hold and weak pull-up circuit of claim 17, wherein said first CMOS inverter and said second CMOS inverter are separately enabled.

20. The bus hold and weak pull-up circuit of claim 17, wherein said resistor is 8 K Ohms.

21. A bus hold and weak pull-up circuit comprising:
   a resistor having a first and a second node, said resistor coupled to a bi-directional I/O pin at said first node;
   a weak pull-up circuit directly coupled to said resistor at said first node; and
   a bus hold circuit coupled to said resistor at said second node and including a first CMOS inverter and a second CMOS inverter wherein said first CMOS inverter and said second CMOS inverter are cross coupled and separately enabled.

22. The bus hold and weak pull-up circuit of claim 21, wherein said weak pull-up circuit comprises a p-channel transistor.

23. The bus hold and weak pull-up circuit of claim 22, wherein said p-channel transistor is gate enable.

* * * * *